(12) United States Patent
Tate et al.

(10) Patent No.: US 8,428,114 B2
(45) Date of Patent: *Apr. 23, 2013

(54) TRANSMIT EQUALIZER COMPENSATION FOR PROBE RECEIVERS

(75) Inventors: Larry R. Tate, Hopkinton, MA (US); Harry R. Rogers, Andover, MA (US)

(73) Assignee: Intel Corporation, Santa Clara, CA (US)

( * ) Notice: Subject to any disclaimer, the term of this patent is extended or adjusted under 35 U.S.C. 154(b) by 494 days.

This patent is subject to a terminal disclaimer.

(21) Appl. No.: 12/604,297

(22) Filed: Oct. 22, 2009

(65) Prior Publication Data

US 2010/0040131 A1 Feb. 18, 2010

Related U.S. Application Data

(63) Continuation of application No. 11/322,510, filed on Dec. 30, 2005, now Pat. No. 7,660,349.

(51) Int. Cl.
*H03H 7/30* (2006.01)

(52) U.S. Cl.
USPC ...... 375/232; 375/240.29; 375/350; 375/224; 375/257; 324/76.28; 324/76.29; 324/76.44; 324/76.31; 324/76.67; 379/387.02; 379/406.08; 379/406.09; 379/406.1; 379/398

(58) Field of Classification Search ............. 375/240.29, 375/350, 232, 224, 257; 379/406.08, 387.02, 379/406.09, 406.1, 398; 324/76.28, 76.29, 324/76.44, 76.31, 76.68

See application file for complete search history.

(56) References Cited

U.S. PATENT DOCUMENTS

| | | | | |
|---|---|---|---|---|
| 3,422,222 | A * | 1/1969 | Lord | 178/69 A |
| 5,442,639 | A * | 8/1995 | Crowder et al. | 714/712 |
| 6,097,203 | A * | 8/2000 | Parker et al. | 324/750.27 |
| 6,686,755 | B2 * | 2/2004 | White et al. | 324/754.31 |
| 2003/0109999 | A1 * | 6/2003 | Stein et al. | 702/86 |
| 2004/0047409 | A1 * | 3/2004 | Lee et al. | 375/232 |
| 2005/0147230 | A1 * | 7/2005 | Bershad et al. | 379/390.02 |
| 2006/0188043 | A1 * | 8/2006 | Zerbe et al. | 375/346 |
| 2007/0001687 | A1 * | 1/2007 | Schneider et al. | 324/605 |

FOREIGN PATENT DOCUMENTS

| | | | |
|---|---|---|---|
| EP | 0760575 | A2 * | 8/1996 |
| EP | 0760575 | A2 * | 8/1996 |
| EP | 0760575 | | 3/1997 |

* cited by examiner

*Primary Examiner* — Daniel Washburn
*Assistant Examiner* — Rahel Guarino
(74) *Attorney, Agent, or Firm* — Blakely, Sokoloff, Taylor & Zafman LLP

(57) ABSTRACT

Transmit equalization over high speed digital communication paths may be compensated in a receiver for a probe on that path. In one example, a probe input provides a signal from an electronic communications path, the signal having been processed by a transmit equalizer. A filter circuit processes the signal to compensate for the transmit equalizer, and a decoder decodes the processed signal and produces an output for use by test equipment.

21 Claims, 9 Drawing Sheets

TRANSMIT EQUALIZER COMPENSATION FOR PROBE RECEIVERS

CROSS-REFERENCE TO RELATED APPLICATIONS

The present application is a continuation of application Ser. No. 11/322,510, filed Dec. 30, 2005 now U.S. Pat. No. 7,660,349, having the same title and inventors, the priority of which is hereby claimed.

FIELD

The present invention applies to test and diagnostic tools for microelectronic devices and, in particular, to compensating for the effects of a transmit equalizer and other factors in evaluating a signal received by a test probe.

BACKGROUND

In many computing systems, a processor or controller in one chip is coupled through a bus to memory, which may be on a separate chip or more often is part of a separate module. A memory module typically includes several memory chips and a memory controller chip all on a small printed circuit board that plugs into the board that carries the controller or the processor. A separate memory module allows the memory to be made by a company other than the one that made the processor or controller and it allows the amount of memory to be changed for different purposes. In many computer applications, the processor is not coupled directly to the memory module, instead the processor is coupled to a memory controller hub through one bus and then the memory controller hub is coupled to one or more memory modules through a second bus. As memories grow larger and processors grow faster, the buses that connect the memory to the processor must increase in bandwidth to be able to carry ever more data in less time. Similar demands are placed on other buses within electronic systems.

In computer applications, to save on the number of pins and traces required by these buses to support the bandwidth of ever faster microprocessor cores, the data rates on the busses that connect the cores to memory, graphics and peripherals scale to higher rates. Rates above 5 Gbps (Gigabits per second) per bus lane are projected for the near future. Rates of 5 Gbps and above are not easily supported using practical cost-competitive circuit boards that use low cost connectors, sockets and materials (e.g. FR4). Such materials introduce distortions and interference in high frequency signals that make it difficult for the chip on the other side of the bus to read the signal that it receives. In order to compensate for these low cost materials, equalization has been used on both parallel and serial buses.

The equalization may be performed using an equalizer on the transmitter side of the bus. Such an equalizer anticipates the changes that will occur in the transmitted signal as it travels across the bus and modifies the signal before it is transmitted in order to compensate. An example of such a compensation is de-emphasis. In other words, the transmit side equalizer pre-distorts the transmitted waveform to account for the distortion that will occur along the entire channel. This can minimize intersymbol interference, loss and other effects at the receiver at the far end of the bus. Alternatively, an equalizer may be placed on the receiver side. A receiver side equalizer will compensate for changes that occur to the signal after it propagates across the bus before a receiver tries to interpret the signal. For more extreme situations or higher accuracy, a combination of transmitter and receiver equalization may be used.

To test and debug microprocessors, memories, other chips, and the busses that connect them, logic probes are used. The probes connect to validation systems and tools. Traditionally, logic probes are a simple metal pin with a handle that can detect the voltage or current in a copper line on a printed circuit board or on a pin of a chip. Boards and chips, as they have become more complex, have also been modified to provide special pads that logic probes can use to make electrical contact. The cost of the pads and the cost of the logic probes can, however, have an impact on the cost of the boards and the chips. In addition, with higher data rates, lower voltages and lower currents, the probes have an increasingly large effect on the integrity of the signals in the busses and on the pins. If the signal is perturbed by the probe, then the validation systems and tools will not generate accurate results. At worst, the components will not operate properly rendering many tests useless.

In order to minimize the impact of the probe on the operation of a chip or a bus, a probe may be attached close to the transmitter at a microprocessor, chipset hub, or memory chip pin. In other cases, the logic probes may be attached to connectors along the bus traces, at the backside of a socket or the backside of through-hole vias in a connector. In order to enhance the signal strength detected by the probe, logic probes may be placed much closer to a transmitter than to a receiver at the far end of the bus. For high bandwidth busses, when the probe is at the receive end of the bus, the received signal is very weak, making it hard for the probe to pick up the signal and increasing the negative impact on the receiver. When the probe is positioned at points closer to the transmitter, the logic probe may pick up a signal that has been pre-distorted by a transmitter equalizer. However, the signal may include transmit equalizer artifacts caused by over equalization because the transmitter equalization (TX EQ) was designed to compensate for the loss at the end of the channel. It therefore overcompensates for probes positioned closer to the transmitter. The logic probe receivers must somehow absorb the link margin degradation associated with the transmit side equalization artifacts. This increases the complexity of the validation systems and reduces the accuracy of test results.

BRIEF DESCRIPTION OF THE DRAWINGS

Embodiments of the present invention may be understood more fully from the detailed description given below and from the accompanying drawings of various embodiments of the invention. The drawings, however, should not be taken to be limiting, but are for explanation and understanding only.

DETAILED DESCRIPTION

In some embodiments of the present invention, an inverse equalizer or a DFE (Decision Feedback Equalizer) together with a TX EQ (Transmit Equalizer) replica is applied at a logic probe receiver to mitigate the over-equalization of the TX EQ. This allows a logic probe to be placed close to the transmitter to take full advantage of the higher signal to noise ratio at the transmitter side of the channel. One form of inverse equalization is to add loss at the probe receiver to mimic being at the end of the channel. DFE, on the other hand, does not introduce any S/N (Signal/Noise) degrading loss to accomplish equalization.

By applying DFE and a TX EQ replica at the probe receiver in conjunction with positioning the probe close to the transmitter, a higher amplitude signal with a higher signal to noise ratio is obtained. Consequently, the logic probe receiver may have a significantly better BER (Bit Error Rate) without affecting the cost and performance efficiency of the production silicon being probed.

Figure 1:
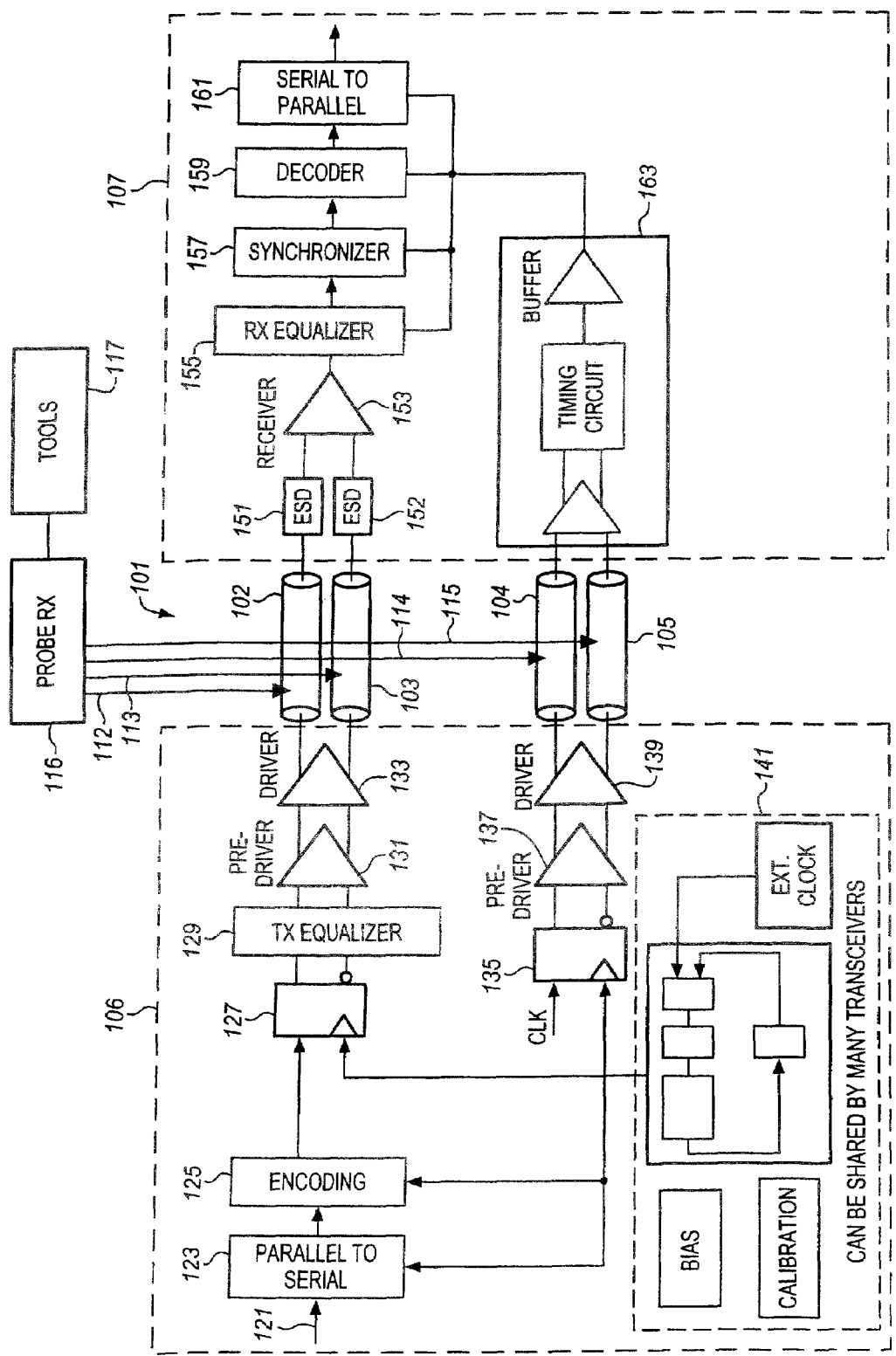
FIG. 1 is a block diagram of a transmitting device and a receiving device coupled together by a probed bus according to an embodiment of the invention.

FIG. 1 shows a general block diagram of a unidirectional high speed link with an attached probe receiver. A bus 101 with four lanes 102, 103, 104, 105 is coupled between a transmitter 106 and a receiver 107. Only portions of the transmitter and receiver are shown for simplicity. The transmitter and receiver may also be portions of other components, such as processors, controllers, hubs, memory, graphics and peripherals. Probes 112, 113, 114, and 115 are coupled to each bus lane, respectively. The probes have conductors, such as insulated wire leads, that are coupled to a probe receiver 116 that is coupled to validation and test systems and tools 117. The probes may be connected by a direct physical and electrical connection or they may be coupled through magnetic induction, capacitive effects or in any of a variety of other ways.

The bus is shown as having four lanes with one probe per lane as an example. Embodiments of the invention may be adapted to apply to a wide range of different buses of different configurations. In addition, while the probes are shown as being coupled to the bus, they may alternatively be coupled to output pins of a chip, to special pads on the chip or a board or to any of a variety of other connection points. In the example of FIG. 1, the transmitter and receiver may be thought of as two chips mounted to a printed circuit board with a bus formed as traces on the board. However, embodiments of the present invention may be adapted to a wide range of other configurations.

On the transmitter 106 side, parallel data 121 arrives on a wide data lane to a parallel to serial converter 123 where it is converted to serial form and then passed to an encoder 125. From the encoder, the now serial data is passed to a latch 127 that clocks the data into a transmit equalizer (TX EQ) 129. The TX EQ takes the encoded and timed serial data and modifies it in order to compensate for distortions that may occur when the data is transmitted over the bus 101. The particular design and functions of the TX EQ may be adapted to suit any particular application and design objectives. The pre-equalized data is then passed to a pre-driver 131 and driver 133 to drive it onto lanes of the bus 102, 103. This signal may be detected by the corresponding probes 112, 113.

Forwarded Clock and data may be routed in the transmitter along a parallel path. Such a parallel path is usually designed to match the paths as much as possible for low frequency jitter tracking (cancellation) at the receiver. The forwarded clock path is shown in the latch 135, predriver 137 and driver 139. The clock waveform does not need to be equalized typically, because it is a fully balanced repetitive waveform. However, an equalizer "mimic" circuit may be used for better matching of circuit parasitic effects and power supply modulation. The drivers drive these signals onto two other lanes of the bus 104, 105 where they may also be detected by connected probes 114, 115. The recovered clock at the probe receiver may be amplified and then appropriately aligned with the data and used to clock a decision circuit in the probe receiver. Similarly, it may be used by the receiver at the end of the bus using the same steps.

In some embodiments, the data is width N with only one forwarded clock, usually in the middle. The clock may also be embedded in the data and recovered by a CDR (clock and data recovery block, not shown). The transmitter may also have a timing and synchronization system 141 to generate the internal clocks. This system may also include bias control circuits and equalization control circuits.

On the receiver 107 side, the data lanes are connected into Electrostatic Discharge Protection Circuits (ESD) 151, 152. The ESDs are coupled into a differential amplifier 153 that is connected to a receiver section. The receiver section may include a receive equalizer (RX EQ) 155 to compensate for effects of the transmission through the bus coupled to a synchronizer 157, to recover the timing of the data coupled to a decoder 159, to reverse the encoding of the transmitter coupled to a serial to parallel converter 161, and to convert the data into a parallel form appropriate for the receiver.

Figure 2:
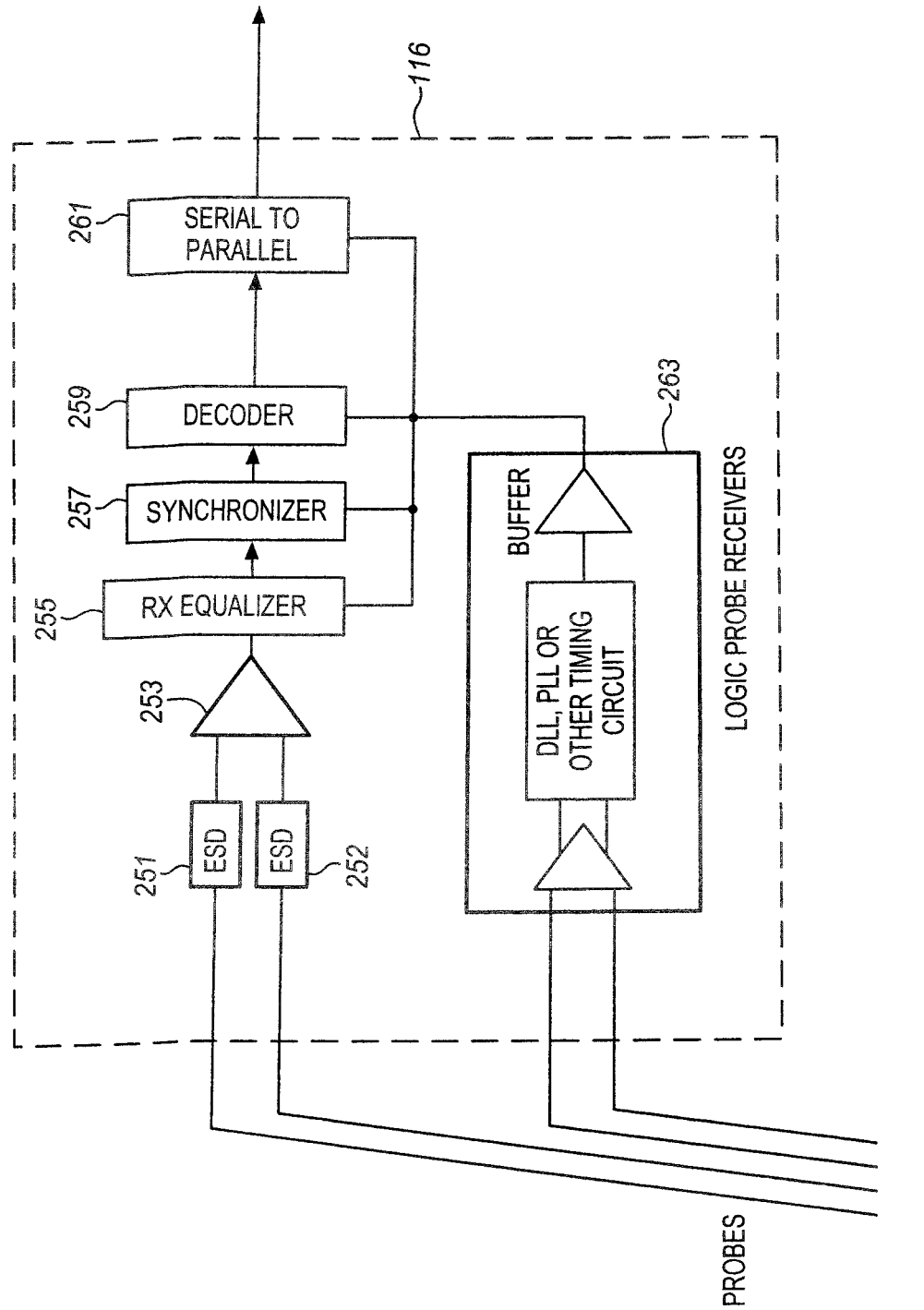
FIG. 2 is block diagram of a probe receiver according to an embodiment of the invention.

The data and forwarded clock lanes 104, 105 of the bus are received in a separate clock receiver 163 that may include amplifiers, buffers and timing circuitry. The clock receiver may be coupled to any or all of the components of the data receiver to provide any control and timing information useful to the data receiver. The recovered clock at the probe receiver may be amplified and then appropriately aligned with a DLL and Phase Interpolator or other timing circuits with the data and ultimately used to clock the decision circuit Referring to FIG. 2, a block diagram of one example of a probe receiver 116 as shown in FIG. 1 is provided. The probes are coupled to an inverse equalizer (INV EQ) to mitigate the effects of the TX EQ artifacts. The inverse equalizer may be formed by replicating the TX EQ structure from the transmitter in the probe receiver with suitable logic modifications to generate the inverse equalization. In the example of FIG. 2, the inverse equalizer replicates the structure of the RX EQ of FIG. 1 with appropriate modifications to accommodate different distances from the Transmitter. The probe receiver interfaces to the validation and test tools 117.

As in FIG. 1, the probes from the data lanes are connected into ESDs 251, 252. The ESDs are coupled into an amplifier 253 that is connected to a receiver section. The amplifier may also include a filter such as an FIR (Finite Impulse Response) filter to reduce effects of the channel between the probe and the receiver. The receiver section, similar to that of FIG. 1, has a receive equalizer (RX EQ) 255 to reverse the TX EQ, a synchronizer 257, a decoder 259 and a serial to parallel converter 261. Probes coupled to the data and forwarded clock lanes 104, 105 route their signals to a separate timing receiver 263 that may be coupled to any or all of the components of the data receiver to provide any control and timing information useful to the data receiver. From the serial to parallel converter, the signals are sent to the tools 117 for interpretation.

Figure 3:
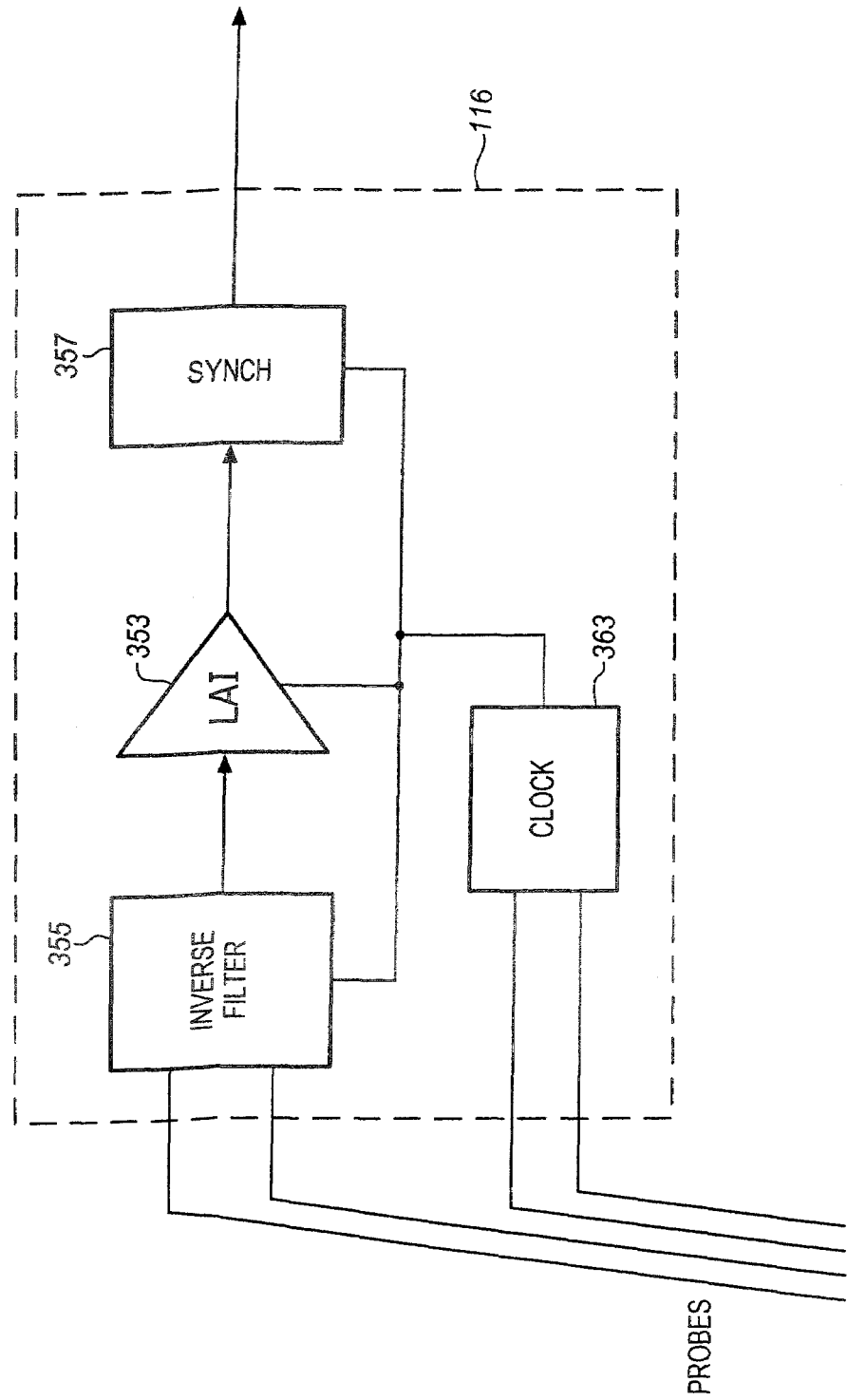
FIG. 3 is a block diagram of an alternate probe receiver according to an embodiment of the invention.

FIG. 3 shows a block diagram of another example of a probe receiver 116. In FIG. 3, the receiver 116 receives the four probe inputs. The clock signals are applied to a timing receiver 363, which provides timing to the other blocks. The data probe signals are applied directly to an inverse filter 355 to reverse the effects of the TX EQ at the transmitter. The filtered signals are then applied to a limiting amplifier 353, which is coupled to a synchronizing circuit 357. The synchronizer output may be applied then to the tools 117 for analysis.

The example of FIGS. 2 and 3 are very simple but require a very high quality inverse or RX equalizer. The voltage swing of the output drivers on the TX EQ is constrained by the available power supply voltages, the semiconductor process, and the circuits. As a result, the TX EQ typically is not able to increase the swing in the output waveform beyond the unequalized swing. Instead, it must decrease the swing to shape the waveform. This will result in some loss of signal and therefore some loss of the signal amplitude over the noise floor (S/N). However, the overall benefit of reduced ISI (Inter-Symbol Interference) at the receiver will in general be more important than the lost S/N for this type of equalizer as applied to a high speed chip-to-chip interconnect.

Practical implementations of an inverse filter as suggested by FIGS. 2 and 3 may use IIR (Infinite Impulse Response) filtering techniques, but may be limited in accuracy by the bit precision of their design. Such a filter is also subject to instability or cycle oscillation limitations. FIR (Finite Impulse Response) techniques may alternatively be applied, but such implementations may suffer from accuracy or complexity issues.

Figure 4:
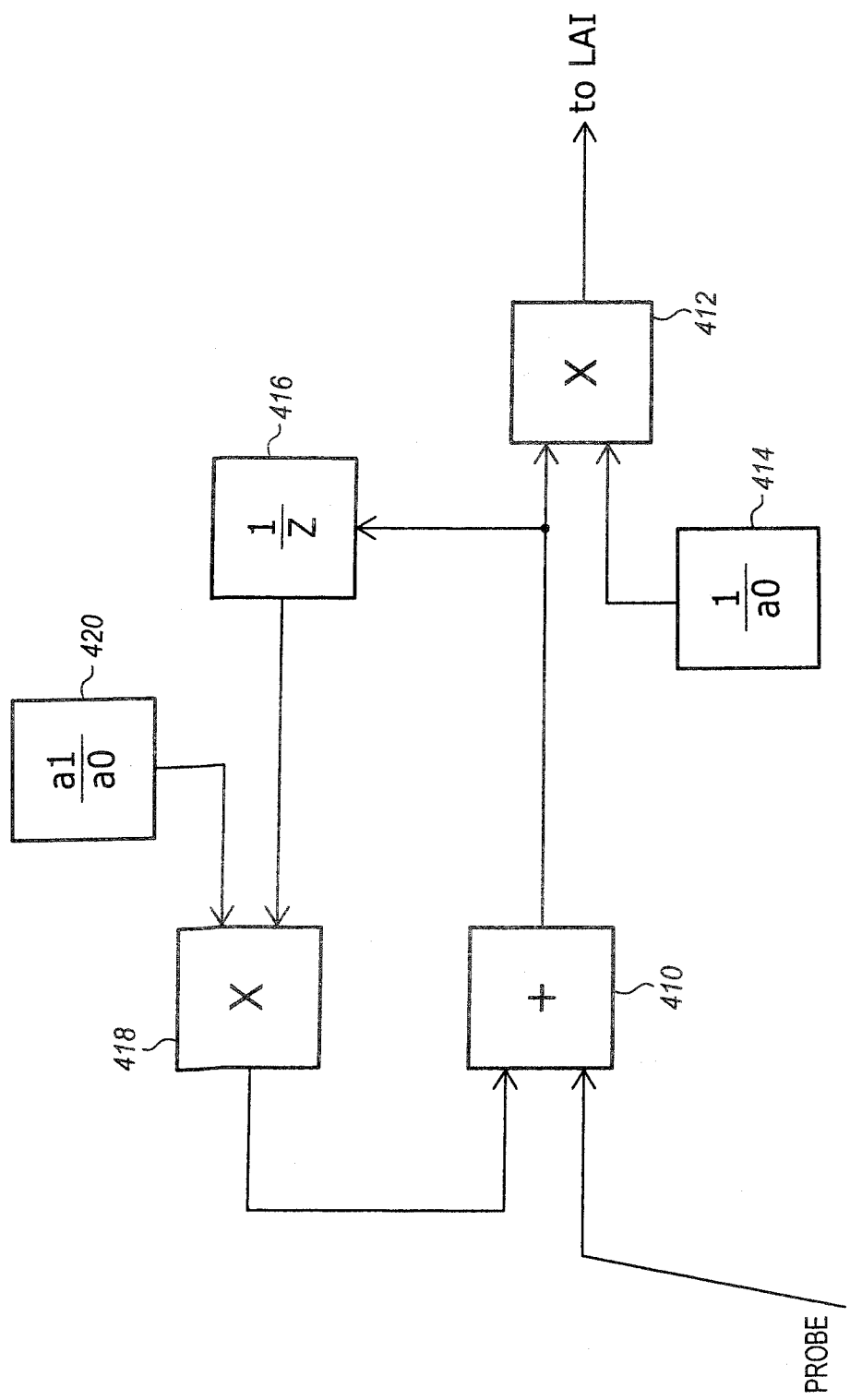
FIG. 4 is a block diagram of an inverse filter that may be used as the inverse filter of the probe receiver in FIGS. 1, 2, and 3 according to an embodiment of the invention.

An example of a block diagram of an inverse equalizer suitable for use as the RX equalizer 255 of FIG. 2 or INV EQ 355 of FIG. 3 is shown in FIG. 4. This filter is an all-pole IIR inverse filter that can be used to invert a corresponding FIR TX EQ filter of a form such as $H(z)=a0+a1z^{-1}$. Where z is the input waveform, H(z) is the filter function and a0 and a1 are tap coefficients. The inverse filter can be characterized as $H^{-1}(z)=(1/a0)(1+(a1/a0)z^{-1})$. Where $H^{-1}(z)$ is the inverse filter function.

Referring to FIG. 4 in more detail, the input from a probe is applied to a summer 410 that combines the probe input with the feedback element. The sum is then applied to a multiplier 412 that combines the sum with a tap coefficient from a tap register 414. The product is the output of the filter that may be applied, for example, to the amplifier 353 of FIG. 3. To produce the feedback signal, the summer 410 output may be applied to a delay line to apply a one unit delay. The delayed signal may then be applied to a second multiplier 418 that multiplies the delayed signal with another filter tap coefficient from a tap register 420. The product of the second multiplier 418 may be applied as the feedback line to the first summer 410.

Figure 5:
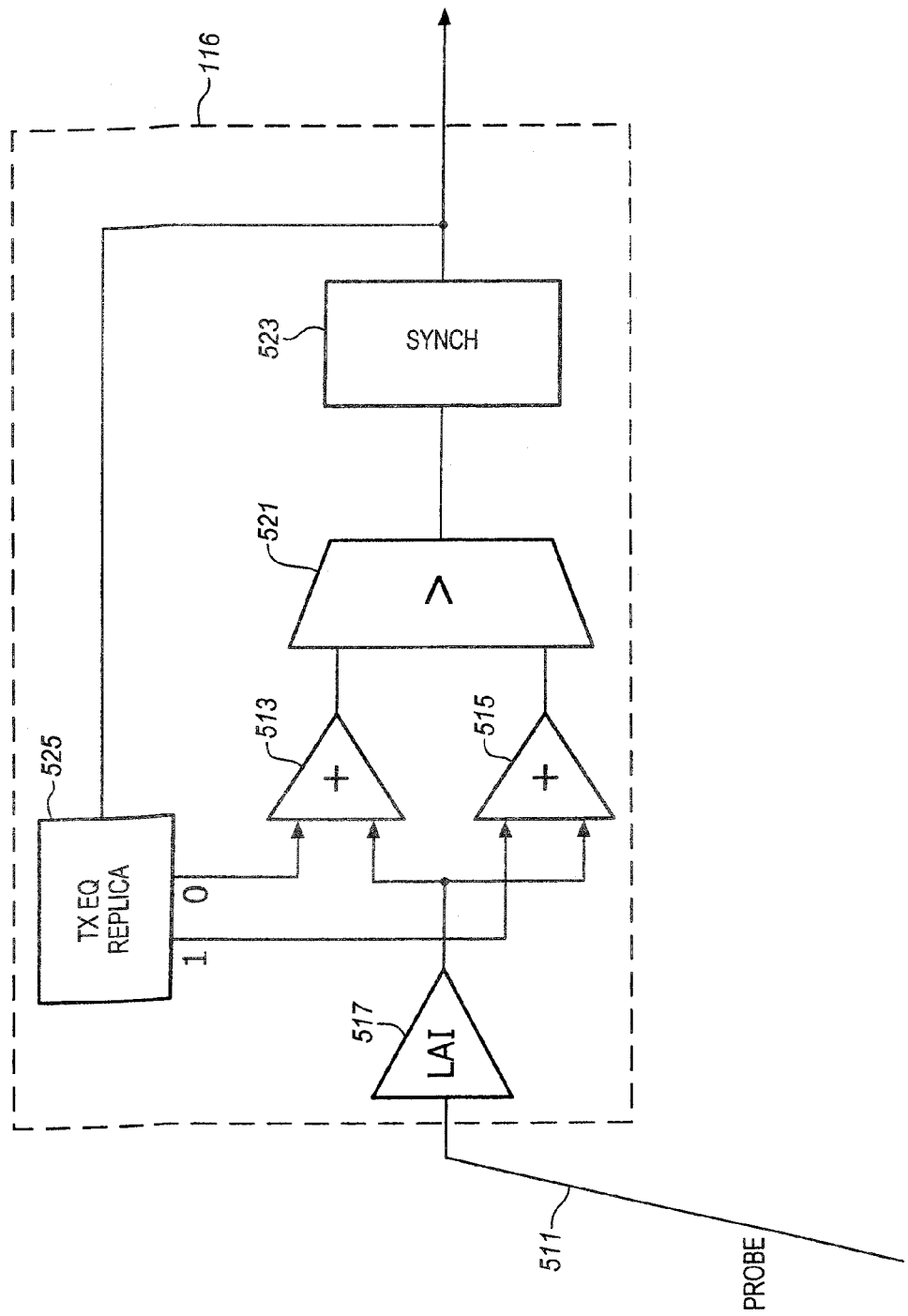
FIG. 5 is a block diagram of another alternate probe receiver according to an embodiment of the invention.

In an alternative embodiment, a DFE (Decision Feedback Equalizer) may be used to resolve the input signal. A DFE may be applied to a multiple output inverse TX EQ. Alternatively, as shown in FIG. 5, a replica of the TX EQ (e.g. an FIR filter) may be used in a DFE to recover the signal. A DFE approach allows the S/N caused by the attenuation introduced by the equalizer to also be compensated.

FIG. 5 is a block diagram of a probe receiver 116 that represents a simple form of a DFE equalizer with a TX EQ replica. Such a receiver may be particularly useful when the probe is very close to the transmitter and there is a low loss channel from the transmitter to the Probe receiver. One function of this simple probe DFE is to compare the input at the receiver to the two outputs of the TX EQ replica. One output assumes that a digital "1" was sent and the other assumes that digital "0" was sent.

In FIG. 5, an example implementation of a portion of the probe receiver including the functions of blocks 253, 255, and 257 from the receiver 116 of FIGS. 1 and 2 is shown. In this example, one probe input signal 511 is shown. This signal is coupled to a limiting amplifier 517 that may also include a filter to reduce channel effects. The amplified output is split and applied to two parallel summers 513, 515. Each summer is coupled to a comparator 521 that is, in turn, coupled to a clocked synchronizer output amplifier 523. The output then may be connected to, for example, the decoder block 259 of FIG. 2.

An inverse TX EQ replica 525 generates an inverse signal for a logic level "1" and for a logic level "0". The inverse signals are shaped and sized so that they reverse the effect of the TX EQ 129 of the transmitter. The inverse signals are each applied to one of the summers. In the example of FIG. 5, the TX EQ replica signal for a 0 is applied to one of the summers 513 and the TX EQ signal for a 1 is applied to the other summer 515. These TX EQ replica signals are each separately combined with a different one of the two split version of the input from the probe and the result is a signal that allows the comparator to select the most likely logic level ("1" or "0"). In one example, the TX EQ replica signals are approximately the same as a signal that would be produced by the TX EQ on the transmitter. In the summer, each signal may be subtracted from the probe signal so that the result that is closest to zero indicates the correct choice. The TX EQ replica signals may alternatively only reduce some or all of the impact of the TX EQ.

In the present example, one purpose of the TX EQ replica signals is to allow the probe receiver to distinguish between a logic 1 state and a logic 0 state. This may or may not require that the signals resemble the original data before equalization. The TX EQ replica signals may be adapted based on the downstream components of the probe receiver. Accordingly, certain effects of the TX EQ may be ignored or corrected less. Other aspects of the input signals may be enhanced based on certain properties of the downstream components. In one embodiment, the INV EQ signals are appropriately scaled using training and calibration algorithms at startup or periodically during use of the probes.

Starting with the signal as it first enters the probe receiver 116, the circuit of FIG. 5 may be used to apply a process. The process begins as the probes sense the signal on the bus and the signal is connected to the probe receiver over a carefully impedance controlled trace. The signal is amplified 517 to account for any loss in the signal path and combined with the two different TX EQ replica signals in the two summers 513, 515 to form the two candidate logic levels. They are then fed into the decision or comparator block 521. The decision block compares the two inputs and determines whether a logic level "1" or logic level "0" was most likely. This may be done, for example, by determining which input signal has the strongest signal margin.

The result is applied to the decision circuit latch 523. This clocked latch records the decision at the optimal point in time based on an input latch signal (not shown). The output from the latch is supplied to the validation and test tools after decoding and serial to parallel conversion (when appropriate). It may also be used to update the TX EQ replica block after an appropriate time delay to keep the state of 525 in synch with the TX EQ state. A training algorithm and associated state machines (not shown) may be used to initialize and synch the state of the TX EQ replica with the actual TX EQ.

Figure 6:
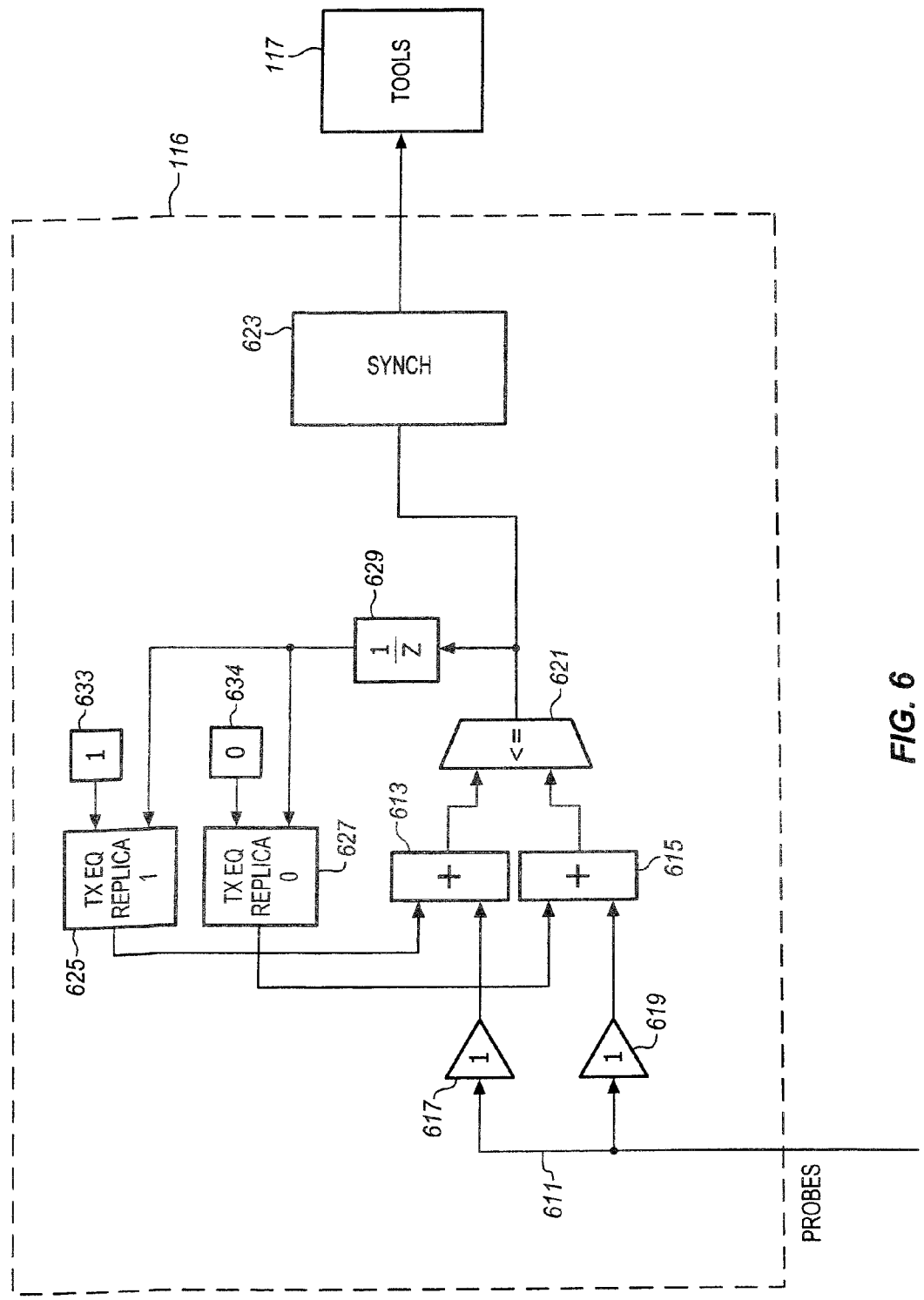
FIG. 6 is a block diagram of another alternate probe receiver according to an embodiment of the invention.

FIG. 6 shows an alternate block diagram of a DFE probe receiver 116 using a pair of TX EQ replicas. In this example, the input signal 611 from the probe is split two ways and both versions are amplified slightly in gain stages 617, 619 to recover from any signal loss in the connections to the receiver 116. These amplifiers may also employ additional filtering as may be appropriate to a particular implementation. The amplifier gain as well as the decision circuit eye timing may be based upon training patterns or other techniques to setup the gains and timing for the decision circuit.

The two versions of the amplified DFE receiver input are applied to respective summers 613, 615. The second input to each summer is a different TX EQ replica. There are two DF (Decision Feedback) FIR filters 625, 627 in the DFE receiver. The upper replica, FIR Replica 1, assumes the input data to the DFE was a "1". The lower replica, FIR Replica 0, assumes the input data to the DFE was a "0" For the upper summer, the amplified probe signal is subtracted from the output of the "FIR Replica" that assumes a "1" and the result is fed to input 1 of a two input comparator (<=) block 621.

The lower FIR Replica output that assumes a "0" input is subtracted from the lower amplified DFE probe signal in the lower summer and this result is sent to the lower input of the comparator (<=) block. The output of the upper and lower summers will be close to zero when the two inputs achieve a good match and they will be close to 1 when they do not match. Accordingly, the comparator block outputs a "1" when the upper input is less than or equal to the lower input. This will only be true when the input to the DFE receiver had been a "1". It will otherwise be "0", implying that the DFE receiver input from the probe was a zero. With proper tuning of the TX EQ replicas and the amplifiers and the timing inputs (not shown), the output of the comparator will fully match the original data sequence from the probed transmitter.

To update the state of the two replica filters to reflect a "1" was received at the input to the receiver, the lower replica filter block "set" input is asserted by a delay block 629 after an appropriate one sample time delay. Similarly, if the DFE receiver input was determined to have been a "0", the "reset" input of the upper replica filter is asserted by the delay block 629 to correctly set the state of the filter. This is done because the original assumption of a "1" was wrong. To apply the set signal, the comparator output is applied to a delay block 629 with two outputs, one for the tap reset line of each TX EQ replica block. The tap inputs from the delay block 629 may be used to keep the state of the TX EQ replicas up-to-date and may be used as the first state element of each FIR filter. In this description, the signal is referred to as being a "0" or a "1". In some implementations, the actual range may be for an analog signal that may be a single ended voltage or a differential voltage, or in some other form.

Figure 7:
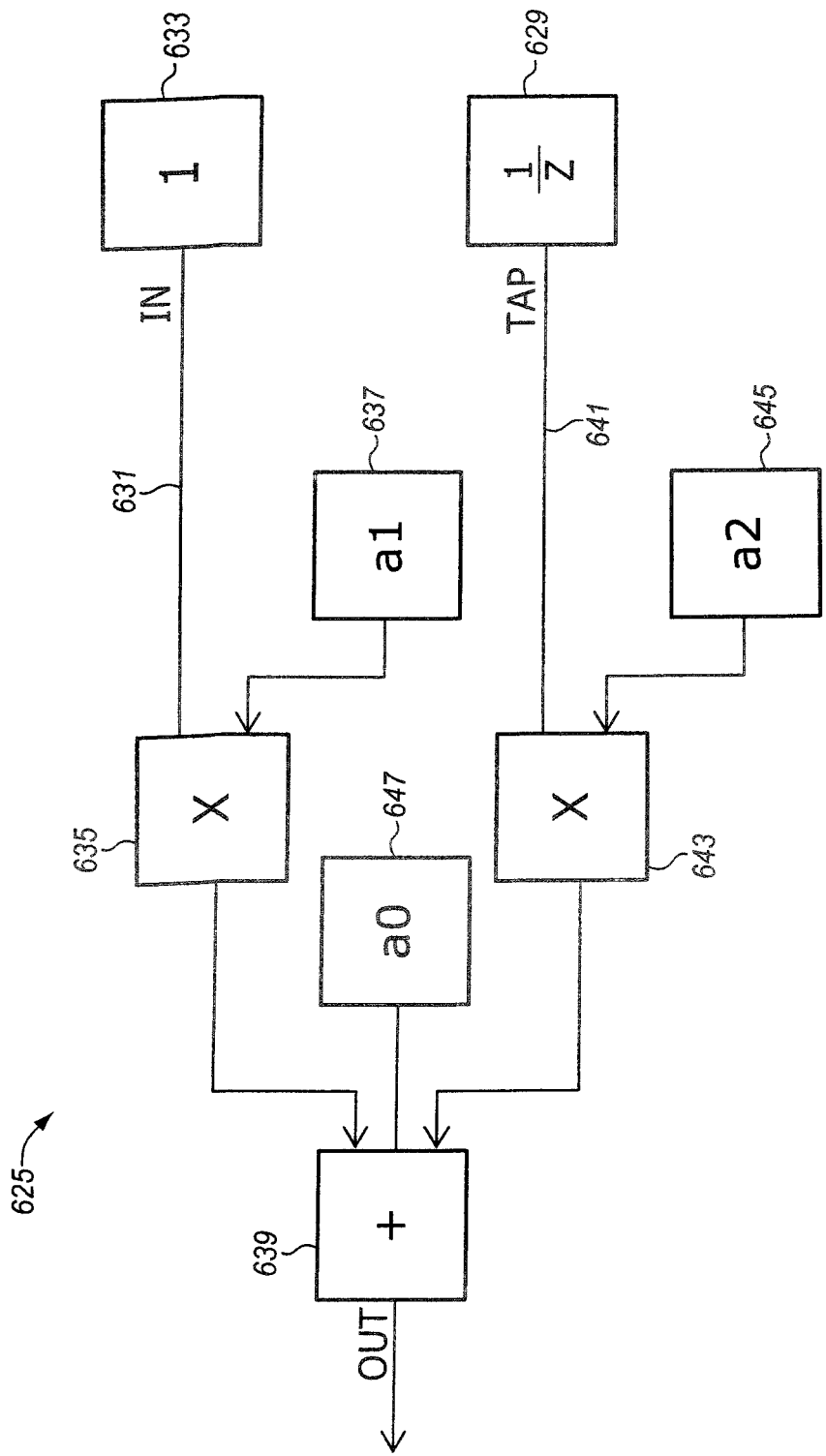
FIG. 7 is a block diagram of a replica transmit equalizer filter that may be used in the probe receiver in FIGS. 1, 5, and 6 according to an embodiment of the invention.

FIG. 7 shows an example of a TX EQ replica 625 in more detail. Such a structure may be applied to any of the described embodiments, but is illustrated specifically in the context of FIG. 6. The TX EQ replica filter, as shown in FIG. 6, receives a "1" input 631 from a tap register 633. This is applied to a multiplier that combines the register signal with a constant from another tap register 637. The result from the multiplier is applied to an adder 639. For the lower TX EQ replica, the input would be a "0" input. The feedback line from the delay register 629 is applied to a second multiplier 643 that combines this value with a constant from another tap register 645. This product is also applied to the summer.

The summer may have more inputs depending on the particular implementation. In the example of FIG. 7, the summer has a third input of a constant from a third tap register 647. The resulting sum is the filter output that is applied to the summer 613, 615 of FIG. 6 to be combined with the amplified probe signal. If the TX EQ circuit of the line that is to be tested is well-known, then the tap coefficients of a simple FIR filter as shown in FIG. 7 may be selected for very high accuracy.

The replica filter in FIG. 7 does not have any internal delay. The two replica filters are fed with a "1" or a "0," respectively and then once the best decision is made by the comparator 621, the state of both of the replica filters must correctly reflect this decision. This is accomplished in the example of FIG. 7 with the single external delay 629 shown as "1/z" in both FIGS. 6 and 7. For higher order filters such as $H(z)=a0+a1*z-1+a2*z-1+a3*z-1+a4*z-1$, only the z−1 term is affected by the decision. The remaining delays may be embedded in the replica circuits. While the replica filters in this description use an FIR structure, a variety of different types of filters and equalizers may be used depending on the particular application.

Figure 8:
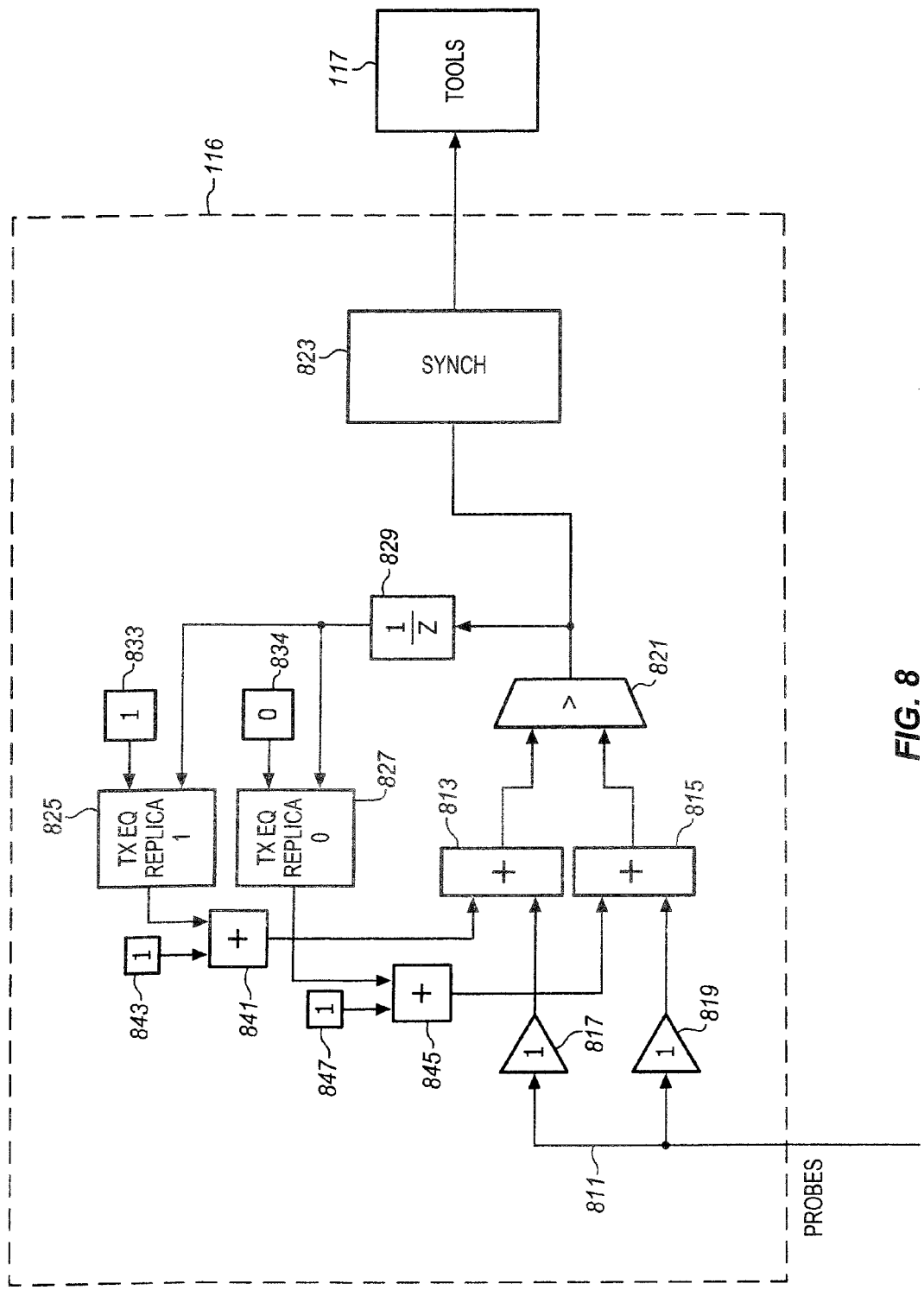
FIG. 8 is a block diagram of another alternate probe receiver according to an embodiment of the invention.

FIG. 8 shows a block diagram of an alternative DFE using FIR-based TX EQ replicas that may be applied to a probe receiver. In FIG. 8, the probe input 611 is divided into an upper "1" path and a lower "0" path. Each path is fed into a gain stage or amplifier 817, 819. The amplifiers may also include filters, such as FIR filters depending on the particular application. The amplifier outputs are fed to respective summers 813, 815 and the summed outputs are applied to a comparator 821. The comparator compares the two signals and decides whether the upper or lower path is the best. It then produces a "1" signal or "0" signal, accordingly. This signal is applied to a synchronizer 823 and any other appropriate devices and then sent downstream to tools 117 for analysis.

The output of the comparator is also applied to delay block (1/z) 829 similar to the delay block of FIG. 6. The delay block is a feedback reset line to upper and lower TX EQ replica filters 825, 827. This delay element serves as the "z−1" term in the two FIR replica filters. This approach has the advantage of restoring the signals to their original voltage swings before feeding them to a decision circuit. The upper filter receives the delay line tap input as well as a "1" input 833. From this, it generates an output that resembles a "1" output from the TX EQ on the signal channel. Similarly, the lower filter receives the delay line tap input and a "0" input 834 to produce an output that resembles a "0" output from the TX EQ on the signal channel. All of the components described above may be similar or identical to corresponding components described above for FIG. 6.

FIG. 8 also shows upper "1" and lower "0" de-emphasis adders 841, 845 coupled between the replica filters 825, 827 and input summers 813, 815. These two add/subtract blocks may be used to pre-compute the amount of de-emphasis that was applied by the TX EQ on the signal channel to the logic "1" and the logic "0", respectively. Each de-emphasis block has a unit gain input 843, 847 that is summed with the replica output. The upper and lower channel filter outputs with de-emphasis may be added back to the original signal copies from the probe to create respective upper and lower path signals, one of which should be a faithful approximation of the original bit stream.

Figure 9:
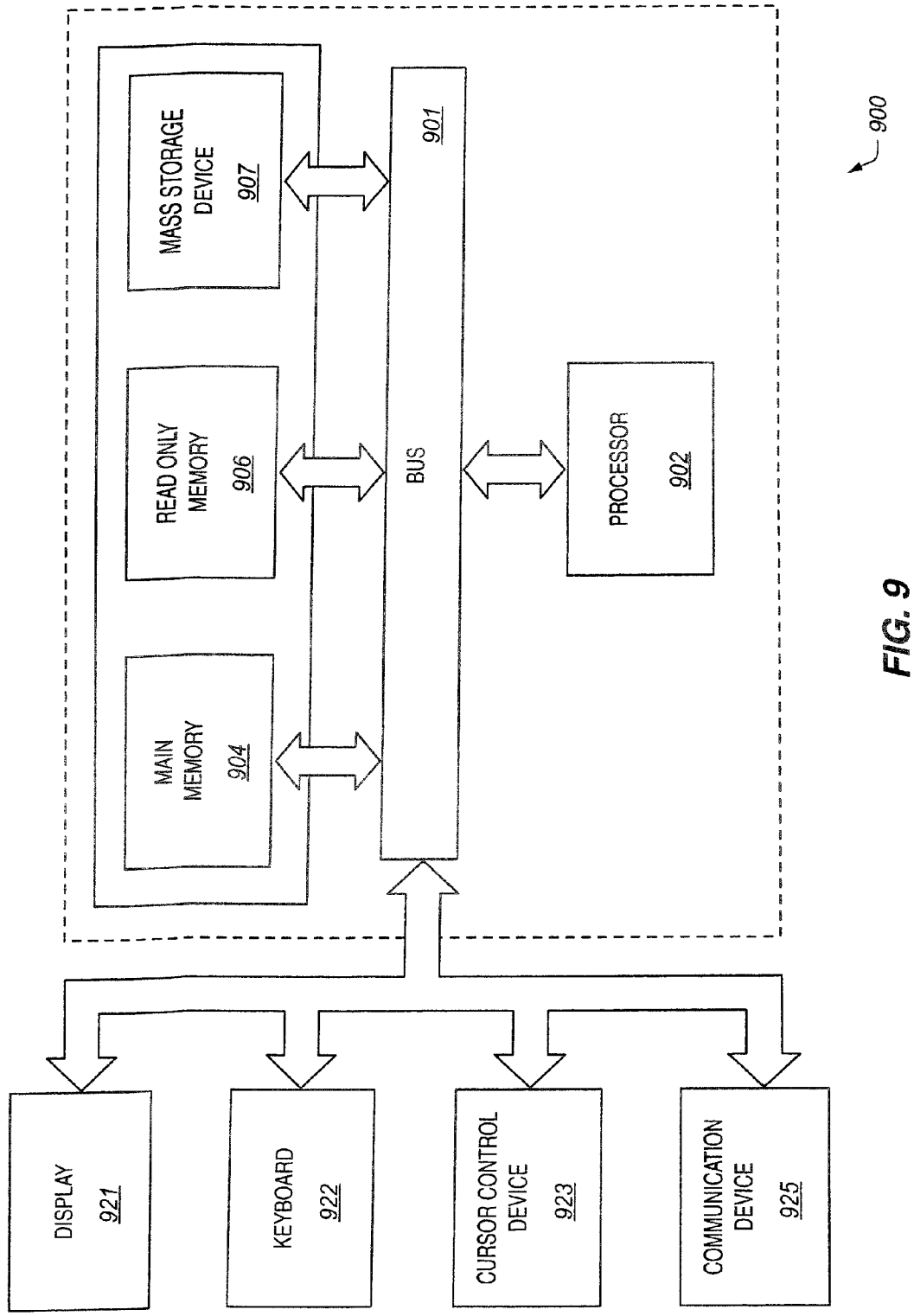
FIG. 9 is a block diagram suitable for applications of the probed bus of FIG. 1 and for implementing diagnostic and test tools according to an embodiment of the invention.

FIG. 9 shows a computer system 920 representing an example of a system upon which features of the present invention may be implemented. The computer system 920 includes a bus 921, such as the bus 101 of FIG. 1 for communicating information, and a processing means such as a microprocessor 922 coupled with the bus 921 for processing information. The computer system 920 further includes a main memory 924, such as a random access memory (RAM) or other dynamic data storage device, coupled to the bus 921 for storing information and instructions to be executed by the processor 922. The main memory also may be used for storing temporary variables or other intermediate information during execution of instructions by the processor.

The computer system may also include a nonvolatile memory 926, such as a read only memory (ROM) or other static data storage device coupled to the bus for storing static information and instructions for the processor. A mass memory 927 such as a magnetic disk or optical disc and its corresponding drive may also be coupled to the bus of the computer system for storing information and instructions.

The computer system can also be coupled via the bus to a display device or monitor 931, such as a cathode ray tube (CRT) or Liquid Crystal Display (LCD), for displaying information to a user. For example, graphical and textual indications of installation status, operations status and other information may be presented to the user on the display device. Typically, an alphanumeric input device 932, such as a keyboard with alphanumeric, function and other keys, may be coupled to the bus for communicating information and command selections to the processor. A cursor control input device 933, such as a mouse, a trackball, or cursor direction keys can be coupled to the bus for communicating direction information and command selections to the processor and to control cursor movement on the display 931.

A communication device 935 is also coupled to the bus 921. The communication device 935 may include a modem, a network interface card, or other well known interface devices, such as those used for coupling to Ethernet, token ring, or other types of physical attachment for purposes of providing a communication link to support a local or wide area network (LAN or WAN), for example. In this manner, the computer system may also be coupled to a number of clients or servers via a conventional network infrastructure, including an intranet or the Internet, for example.

It is to be appreciated that a lesser or more equipped computer system than the example described above may be preferred for certain implementations. Therefore, the configuration of the exemplary computer system 920 will vary from implementation to implementation depending upon numerous factors, such as price constraints, performance requirements, technological improvements, or other circumstances. The communications interfaces of such a computer system may be analyzed using probes and probe receivers as described above. In addition, the validation systems and tools described above may be implemented on such a computer system.

Embodiments of the present invention may be provided as a computer program product which may include a machine-readable medium having stored thereon instructions which may be used to program a general purpose computer, mode distribution logic, memory controller or other electronic devices to perform a process. The machine-readable medium may include, but is not limited to, floppy diskettes, optical disks, CD-ROMs, and magneto-optical disks, ROMs, RAMs, EPROMs, EEPROMs, magnet or optical cards, flash memory, or other types of media or machine-readable medium suitable for storing electronic instructions. Moreover, embodiments of the present invention may also be downloaded as a computer program product, wherein the program may be transferred from a remote computer or controller to a requesting computer or controller by way of data signals embodied in a carrier wave or other propagation medium via a communication link (e.g., a modem or network connection).

It is to be appreciated that a lesser or more complex probe, probe receiver, inverse equalizer, and training and calibration algorithms may be used than those shown and described herein. Therefore, the configurations may vary from implementation to implementation depending upon numerous factors, such as price constraints, performance requirements, technological improvements, or other circumstances. Embodiments of the invention may also be applied to other types of electronic communication paths that use different materials and different communicating devices than those shown and described herein.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. An apparatus comprising:
    a probe input to provide a signal from an electronic communications path, the signal having been processed by a transmit equalizer before being applied to the electronic communications path;
    a filter circuit to process the signal to compensate for the transmit equalizer; and
    a decoder to decode the processed signal and produce an output for use by test equipment.

2. The apparatus of claim 1, wherein the probe input comprises a conductor coupled to an inductive loop, the inductive loop being coupled to a communications bus for a microelectronic circuit.

3. The apparatus of claim 1, wherein the filter circuit comprises an inverse equalizer to reverse the effect of the transmit equalizer.

4. The apparatus of claim 3, wherein the inverse equalizer is coupled to a summer to combine an equalizer signal with the probe input to process the signal.

5. The apparatus of claim 1, wherein the filter circuit comprises a replica of the transmit equalizer to generate a replica of a signal produced by the transmit equalizer.

6. The apparatus of claim 5, wherein the filter circuit comprises a first replica circuit to produce a first replica signal and a second replica circuit to produce a second replica signal.

7. The apparatus of claim 6, further comprising two summers, each coupled to the respective replica circuit, and a decision block coupled to the two summers, the summers combining the respective replica signals with a copy of the probe input signal, and wherein the decision block compares the results from the two summers to determine whether the probe input signal is closer to the first replica signal or to the second replica signal.

8. The apparatus of claim 5, further comprising two summers, each coupled to the filter circuit, and a decision block coupled to the two summers, wherein the filter circuit produces an inverse signal for a logic 1 and provides it to one summer and produces an inverse signal for a logic 0 and provides it to another summer, wherein the summers combine the respective filter circuit signal with the probe input signal, and wherein the decision block compares the results from the two summers to determine whether the probe input signal represents a logic 1 or a logic 0.

9. The apparatus of claim 3, wherein the inverse equalizer is coupled to the output of the decoder for training.

10. A circuit test probe apparatus comprising:
   a probe to apply to a signal path to detect a signal on the signal path;
   a filter circuit to process the detected signal to compensate for equalization applied to the detected signal before being applied to the signal path;
   a decoder to decode the processed signal and produce an output; and
   test equipment to apply metrics to the output.

11. The apparatus of claim 10, wherein the probe comprises an inductive loop, the inductive loop being coupled to the signal path.

12. The apparatus of claim 10, wherein the filter circuit comprises an inverse equalizer to reverse the effect of a transmit equalizer.

13. The apparatus of claim 10, wherein the filter circuit comprises a replica of the transmit equalizer to produce a replica signal and a summer to combine the replica signal with the detected signal.

14. The apparatus of claim 13, wherein the filter circuit further comprises a second replica of the transmit equalizer and a second summer coupled to the second replica, wherein the first replica circuit produces an approximation of a first logic level on the signal path and the second replica produces an approximation of a second logic level on the signal path and wherein the first and second summers each combine the first and second approximations respectively, with the detected signal.

15. The apparatus of claim 14, wherein the filter circuit further comprises a comparator to compare the outputs of the two summers and select the output that indicates the most likely logic level of the detected signal.

16. The apparatus of claim 10, wherein the filter circuit comprises a decision feedback equalizer to generate a signal corresponding to different possible logic levels of the detected signal and to generate a decision of which logic level is most likely.

17. A method comprising:
   providing a probe input signal from an electronic communications path, the signal having been processed by a transmit equalizer before being applied to the electronic communications path;
   processing the signal to compensate for the transmit equalizer; and
   decoding the processed signal to produce an output for use by test equipment.

18. The method of claim 17, wherein processing the signal comprises reversing the effect of the transmit equalizer.

19. The method of claim 17, wherein processing the signal comprises combining an equalizer signal with the probe input to process the signal.

20. The method of claim 17, wherein processing the signal comprises applying an inverse equalization to copies of the probe input signal and comparing the results to determine a likely logic level carried by the electronic communications path.

21. The method of claim 17, wherein processing the signal comprises producing an inverse signal for a first logic level and an inverse signal for a second logic level, combining the inverse signal with respective copies of the probe input signal and comparing the combined signals to determine whether the probe input signal represents the first logic level or the second logic level.

* * * * *